(12) United States Patent
Ren et al.

(10) Patent No.: US 11,089,142 B2
(45) Date of Patent: Aug. 10, 2021

(54) PROCESS OF PROCESSING MIDDLE FRAME OF MOBILE PHONE

(71) Applicant: GUANGDONG EVERWIN PRECISION TECHNOLOGY CO., LTD., Dongguan (CN)

(72) Inventors: Xiangsheng Ren, Dongguan (CN); Lidong Wang, Dongguan (CN)

(73) Assignee: GUANGDONG EVERWIN PRECISION TECHNOLOGY CO., LTD., Dongguan (CN)

( * ) Notice: Subject to any disclaimer, the term of this patent is extended or adjusted under 35 U.S.C. 154(b) by 389 days.

(21) Appl. No.: 16/088,823

(22) PCT Filed: Mar. 13, 2018

(86) PCT No.: PCT/CN2018/078891
§ 371 (c)(1),
(2) Date: Sep. 27, 2018

(87) PCT Pub. No.: WO2019/140769
PCT Pub. Date: Jul. 25, 2019

(65) Prior Publication Data
US 2020/0384585 A1 Dec. 10, 2020

(30) Foreign Application Priority Data

Jan. 17, 2018 (CN) .......................... 201810043852.7
Jan. 17, 2018 (CN) .......................... 201810044384.5
(Continued)

(51) Int. Cl.
*H04M 1/02* (2006.01)
*H04B 1/03* (2006.01)
(Continued)

(52) U.S. Cl.
CPC ....... *H04M 1/0252* (2013.01); *H04M 1/0249* (2013.01); *H05K 5/0004* (2013.01); *H05K 5/0217* (2013.01)

(58) Field of Classification Search
CPC .. H04M 1/0252; H04M 1/0249; H04M 1/185; H04M 1/02; H04B 1/03; H04B 1/08; H05K 5/004; H05K 5/0217
See application file for complete search history.

(56) References Cited

U.S. PATENT DOCUMENTS 5,819,407 A 10/1998 Terada
7,733,653 B1 * 6/2010 Horng ................. H01L 21/4882
361/704
(Continued)

FOREIGN PATENT DOCUMENTS

CN 102316294 A 1/2012
CN 102413210 A 4/2012
(Continued)

*Primary Examiner* — Andrew Wendell
(74) *Attorney, Agent, or Firm* — Carlson, Gaskey & Olds

(57) ABSTRACT

The present disclosure discloses a process of processing a middle frame of a mobile phone, which includes: providing at least two metal components, each of the metal components defining a riveting groove; providing a metal middle plate having a riveting projection at edges thereof; correspondingly mounting each of the metal components on the edges of the metal middle plate to form a border frame surrounding the metal middle plate, respectively; the riveting projection being received in the riveting groove of the metal component, the riveting projection being in clearance fit with the riveting groove; and applying a force to the border frame to deform at least one of the riveting groove and the riveting projection, such that the riveting projection is latched in the riveting groove, and the border frame and the metal middle plate are connected to form the middle frame of the mobile phone.

20 Claims, 12 Drawing Sheets

(30) Foreign Application Priority Data

Jan. 17, 2018 (CN) .......................... 201810044789.9
Jan. 17, 2018 (CN) .......................... 201810045746.2

(51) Int. Cl.
*H04B 1/08* (2006.01)
*H05K 5/00* (2006.01)
*H05K 5/02* (2006.01)

(56) References Cited

U.S. PATENT DOCUMENTS

| | | | |
|---|---|---|---|
| 9,143,181 B1* | 9/2015 | Jia .......................... | G06F 1/1628 |
| 2014/0062273 A1* | 3/2014 | Lee ...................... | H05K 5/0221 |
| | | | 312/223.1 |
| 2015/0245495 A1* | 8/2015 | Surasigcha ........... | B05C 21/005 |
| | | | 118/505 |
| 2017/0311467 A1* | 10/2017 | Anderson, III ...... | H05K 5/0226 |
| 2018/0342820 A1* | 11/2018 | He ....................... | H05K 7/1061 |
| 2020/0338623 A1* | 10/2020 | Ren .......................... | H04M 1/02 |

FOREIGN PATENT DOCUMENTS

| | | |
|---|---|---|
| CN | 103402340 A | 11/2013 |
| CN | 103974576 A | 8/2014 |
| CN | 104269119 A | 1/2015 |
| CN | 104551562 A | 4/2015 |
| CN | 205263711 U | 5/2016 |
| CN | 205356438 U | 6/2016 |
| CN | 205356439 U | 6/2016 |
| CN | 205487360 U | 8/2016 |
| CN | 106304748 A | 1/2017 |
| CN | 107087366 A | 8/2017 |
| CN | 107244034 A | 10/2017 |
| CN | 107322245 A | 11/2017 |
| CN | 107402550 A | 11/2017 |
| CN | 107414333 A | 12/2017 |
| JP | H11342437 A | 12/1999 |
| WO | 03026816 A1 | 4/2003 |
| WO | 2017084271 A1 | 5/2017 |

* cited by examiner

PROCESS OF PROCESSING MIDDLE FRAME OF MOBILE PHONE

CROSS-REFERENCE TO RELATED APPLICATION

This application is the national phase of International Application No. PCT/CN2018/078891, filed on Mar. 13, 2018, which claims the benefit of Chinese Patent Application No. 2018100447899, filed on Jan. 17, 2018, entitled "PROCESS OF PROCESSING MIDDLE FRAME OF MOBILE PHONE", Chinese Patent Application No. 2018100457462, filed on Jan. 17, 2018, entitled "PROCESS OF PROCESSING MIDDLE FRAME OF MOBILE PHONE", Chinese Patent Application No. 2018100443845, filed on Jan. 17, 2018, entitled "PROCESS OF PROCESSING MIDDLE FRAME OF MOBILE PHONE", and Chinese Patent Application No. 2018100438527, filed on Jan. 17, 2018, entitled "METAL MIDDLE FRAME AND PROCESS OF PROCESSING METAL MIDDLE FRAME", the entire content of which are incorporated herein in its entirety.

TECHNICAL FIELD

The present disclosure relates to the technical field of mobile phone component processing, and particularly relates to a process of processing a middle frame of a mobile phone.

BACKGROUND

The metal housing used on the mobile phone not only has a beautiful appearance, but also has the advantages of delicate hand feeling, wear resistance, drop resistance, corrosion resistance, easy recycling, and the like, and thus is popular among consumers. The middle frame is an important part of the mobile phone, and its appearance is smooth and the inner structure is complicated. Currently, the common manufacturing methods of the middle frame of the mobile phone are as follows: 1. the whole piece of aluminum alloy, stainless steel, steel and other plates are CNC cut, drilled, and milled. This method consumes a large amount of raw materials, has a large CNC processing, low processing efficiency, and high cost. However, the technology is relatively simple, and it is currently the most important processing form of the metal middle frame of the mobile phone. 2. Thin aluminum alloy, stainless steel, and other plates are forged to achieve the required processing size, which can reduce CNC processing, thereby reducing manufacturing costs. Both of the aforementioned production methods form a large-area waste portion in the middle portion of the middle frame of the mobile phone, and then the middle portion is cut by the CNC. In addition, both of them have the problems of complicated method and low efficiency.

SUMMARY

According to various embodiments of present disclosure, a process of processing a middle frame of a mobile phone is provided.

A process of processing a middle frame of a mobile phone includes:

providing at least two metal components, each of the metal components defining a riveting groove thereon;

providing a metal middle plate having a riveting projection at edges thereof;

correspondingly mounting each of the metal components on the edges of the metal middle plate to form a border frame surrounding the metal middle plate, respectively; the riveting projection being received in the riveting groove of the metal component, the riveting projection being in clearance fit with the riveting groove; and applying a force to the border frame to deform at least one of the riveting groove and the riveting projection, such that the riveting projection is latched in the riveting groove, and the border frame and the metal middle plate are connected to form the middle frame of the mobile phone.

The details of one or more embodiments of present disclosure are set forth in the accompanying drawings and the description below. Other features, objects, and advantages of present disclosure will be apparent from the description and drawings, and from the claims.

BRIEF DESCRIPTION OF THE DRAWINGS

To illustrate the embodiments and/or examples according to present disclosure more clearly, the accompanying drawings for describing the embodiments or the prior art are introduced briefly in the following. Additional details or examples are not intended to limit the scope of present disclosure, the illustrated embodiments and/or a best mode in any manner.

DETAILED DESCRIPTION OF THE EMBODIMENTS

Embodiments of the present disclosure are described more fully hereinafter with reference to the accompanying drawings. An embodiment is described in the accompanying drawings. The various embodiments of the present disclosure may, however, be embodied in many different forms and should not be construed as limited to the embodiments set forth herein. Rather, these embodiments are provided so that this disclosure will be thorough and complete, and will fully convey the scope of the present disclosure to those skilled in the art.

It will be understood that when an element is referred to as being "fixed" to another element, it can be directly fixed to the other element or intervening elements may be presented. Also, when an element is referred to as being "connected" or "coupled" to another element, it can be directly connected or coupled to the other element or intervening elements may be present.

Unless otherwise defined, all terms (including technical and scientific terms) used herein have the same meaning as commonly understood by one of ordinary skill in the art to which this invention belongs. The terms used herein is for the purpose of describing particular embodiments only and is not intended to limit the present disclosure.

Embodiment 1

Figure 1:
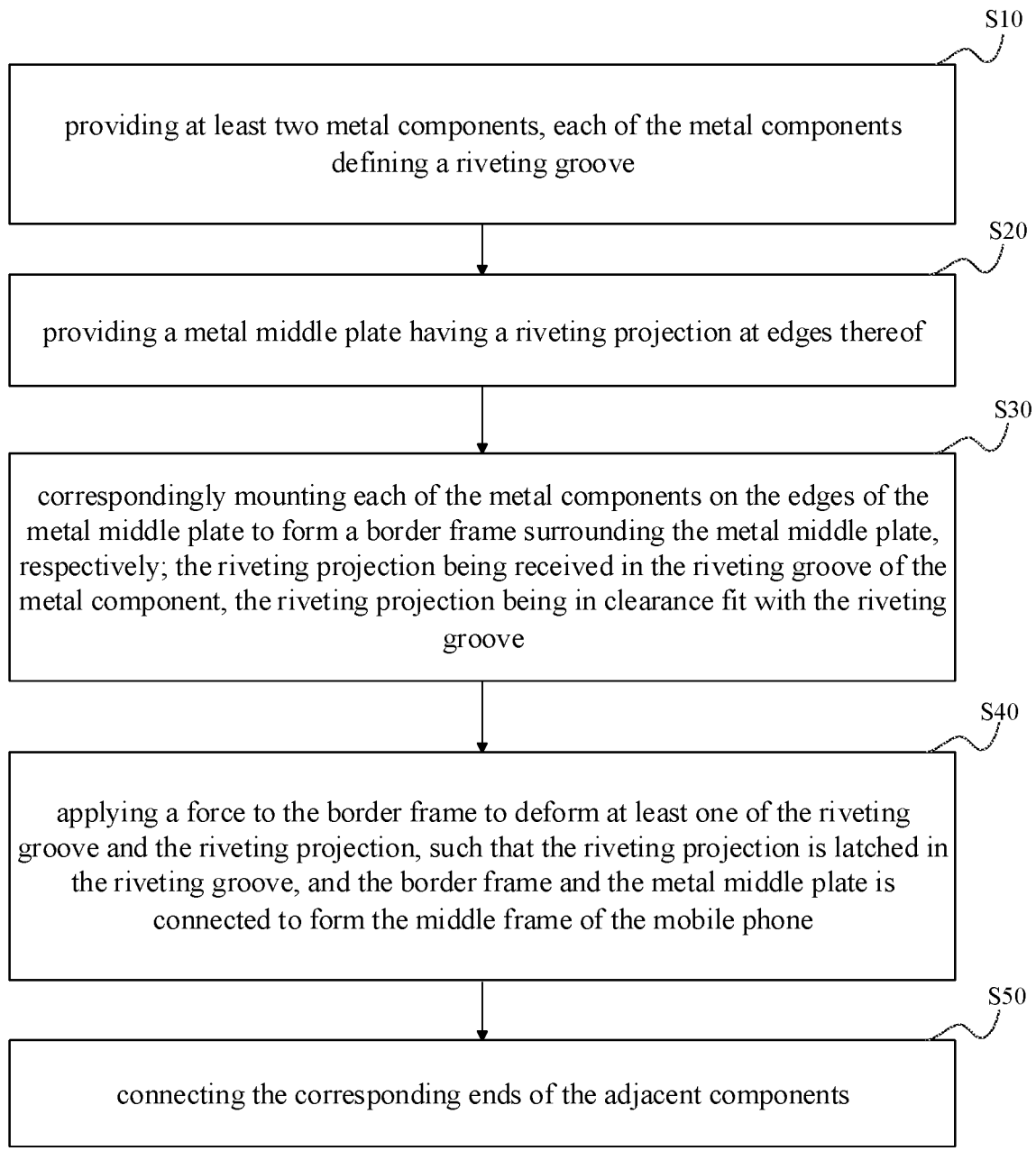
FIG. 1 is a flowchart of the present disclosure.

Referring to FIG. 1, the illustrated embodiment discloses a process of processing a middle frame of a mobile phone, which includes the following steps of:

In step S10, at least two metal components are provided. A riveting groove is formed on each of the metal components.

Figure 2:
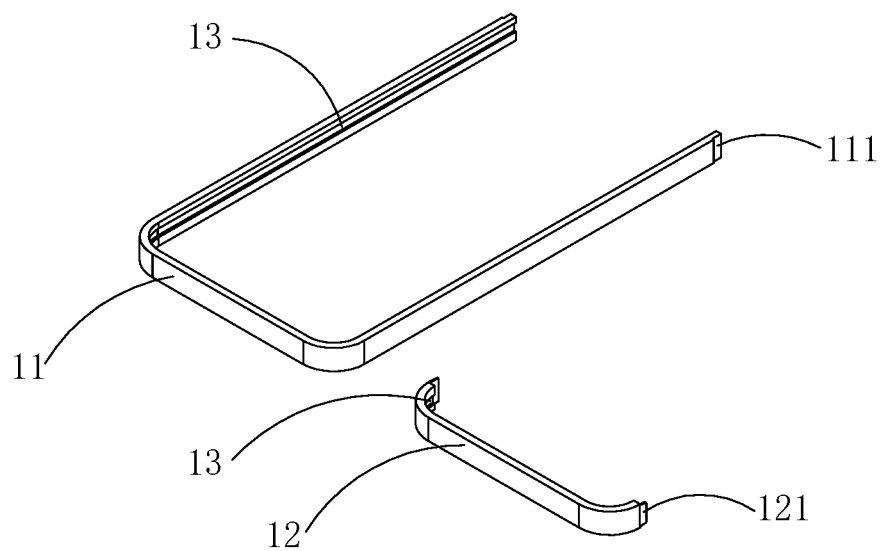
FIG. 2 is a perspective view showing a first metal component and a second metal component according to a first embodiment.

Referring to FIG. 2, in the illustrated embodiment, the number of the metal components is two, which are located on a first metal component 11 and a second metal component 12, respectively. A length of the first metal component 11 after the first metal component 11 is unfolded in a linear structure is greater than a length of the second metal component 12 after the second metal component 12 is unfolded in a linear structure. An inner side surface of the first metal component 11 and an inner side surface of the second metal component 12 both define one riveting groove 13. Each end of the first metal component 11 defines a positioning groove 111, and each end of the second metal component 12 is provided with a positioning block 121.

In the illustrated embodiment, a hardness difference between the metal component and a metal middle plate 20 is 170 HV to 350 HV. This hardness range enables the metal component to squeeze a riveting projection 21 of the middle plate material to deform in a case where the metal component is squeezed and compressed. In the illustrated embodiment, the metal component may be made of a stainless steel material, and a hardness of the stainless steel may be 180 HV to 220 HV. In alternative embodiments, the metal component can also be made of a titanium material.

Figure 3:
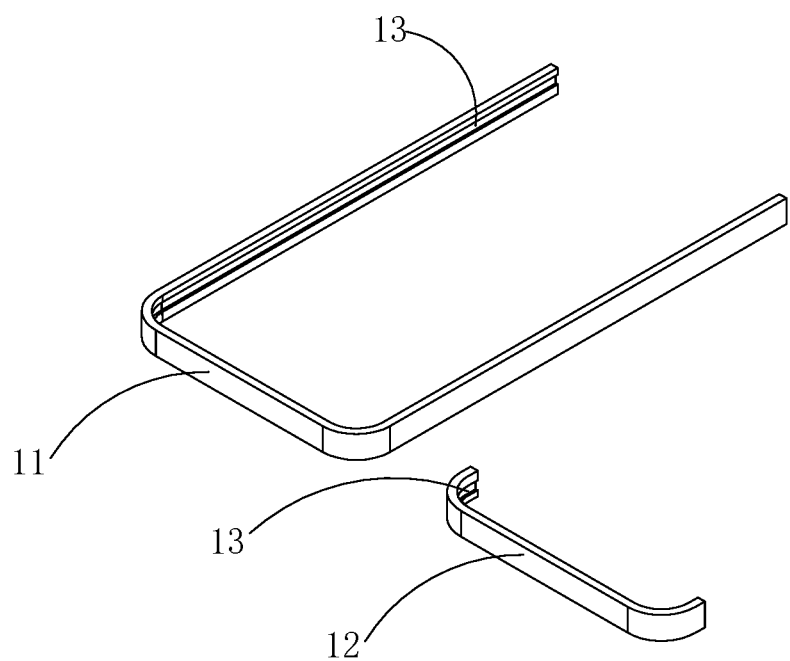
FIG. 3 is a perspective view showing the first metal component bent from a first linear profile and the second metal component bent from a second linear profile according to the first embodiment.

The step S10 specifically includes: in step S11, two linear profiles having the riveting grooves 13 are fabricated, which are a first linear profile and a second linear profile, respectively; in step S12, the first linear profile and the second linear profile are bent to form the first metal component 11 and the second metal component 12 as shown in FIG. 3, respectively; in step S13, the positioning groove 111 is processed at each of the ends of the first metal component 11, and the positioning block 121 is processed at each of the ends of the second metal component 12.

The linear profile and the riveting groove 13 are synchronously processed or separately processed. In the illustrated embodiment, the linear profile and the riveting groove 13 are processed separately. The linear profile is firstly processed, and then the riveting groove 13 is CNC processed on the linear profile.

When the linear profile and the riveting groove 13 are processed stepwise, the linear profile can be fabricated by two methods: one is by cutting from a sheet material and the other is by a drawing method. Compared to the fabrication of the linear profile by forging, these two methods produce less intermediate waste, which helps to reduce waste cleaning time and improve material utilization.

In step S20, a metal middle plate having the riveting projection at edges thereof is provided.

Figure 4:
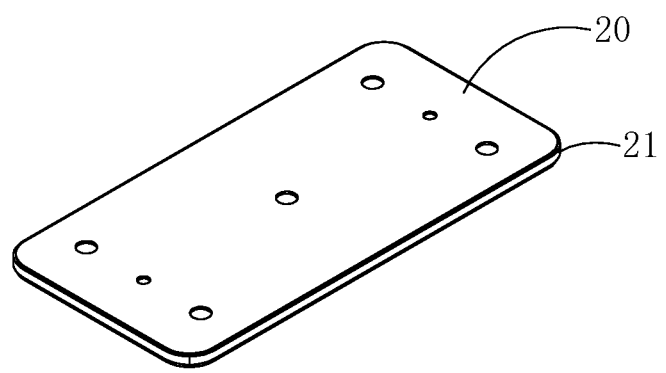
FIG. 4 is a perspective view of a metal middle plate according to the first embodiment.

As shown in FIG. 4, the metal middle plate 20 has a rectangular shape. The metal middle plate 20 is provided with the riveting projection 21 at the edges thereof. The number of the riveting projection 21 is one, and the riveting projection 21 is disposed surrounding the metal middle plate 20. A hardness of the metal middle plate is 90 HV to 100 HV. The metal middle plate 20 with this hardness range can be deformed without a large squeezing force, thereby facilitating the compressive deformation of the riveting projection 21. In addition, this hardness range is also advantageous for the processing of the metal middle plate 20. Moreover, the metal middle plate 20 is made of a lightweight soft metal material, such as aluminum, aluminum alloy, magnesium, magnesium aluminum alloy, and the like. The metal middle plate 20 made of this type of metal material can reduce the weight of the entire middle frame of the mobile phone.

Furthermore, the metal middle plate 20 may be made of an aluminum material. Aluminum is a lightweight and easy to process metal material. By configuring the metal middle plate 20 to be made of the aluminum material, the weight of the entire middle frame of mobile phone can be reduced, and the subsequent processing of the middle frame of the mobile phone can be facilitated.

In step S30, each of the metal components is correspondingly mounted on the edges of the metal middle plate 20 respectively to form a border frame 10 surrounding the metal middle plate 20. The riveting projection 21 is received in the riveting groove 13 of the metal component, and the riveting projection 21 is in clearance fit with the riveting groove 13.

Figure 5:
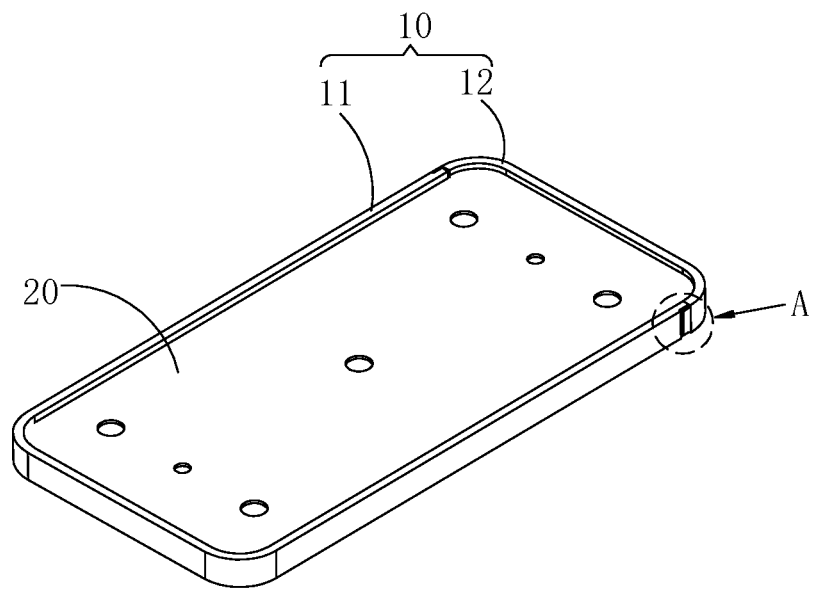
FIG. 5 is a perspective view showing a combination of the first metal component, the second metal component, and the metal middle plate according to the first embodiment.
Figure 6:
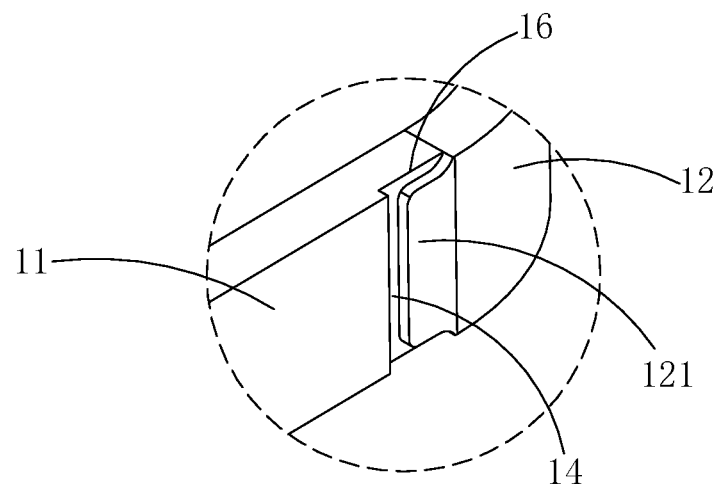
FIG. 6 is an enlarged view of a circled portion A of FIG. 5.

In the illustrated embodiment, the number of the metal components is two, which is the first metal component 11 and the second metal component 12, respectively. Therefore, during assembly, the first metal component 11 is mounted on the edges of the metal middle plate 20 from one end of the metal middle plate 20 by inserting. During inserting, the riveting groove portions on two arms of the first metal component 11 are aligned with the riveting projection portions at both sides of the metal middle plate 20, respectively, such that the riveting projection 21 can be inserted into the riveting groove 13 of the first metal component 11. Similarly, the second metal component 12 is mounted on the edges of the metal middle plate 20 from the other end of the metal middle plate 20 by inserting. During inserting, the riveting groove portions on two arms of the second metal component 12 are aligned with the riveting projection portions at both sides of the metal middle plate 20, respectively, such that the riveting projection 21 can be inserted into the riveting groove 13 of the second metal component 12. After the first metal component 11 and the second metal component 12 are mounted on the edges of the metal middle plate 20, the positioning block 121 on the second metal component 12 is inserted into the positioning groove 111 of the first metal component 11. As shown in FIG. 5, the first metal component 11 and the second metal component 12 cooperatively form the border frame 10 surrounding the metal middle plate 20. Since the length of the first metal component 11 after the first metal component 11 is unfolded in the linear structure is greater than the length of the second metal component 12 after the second metal component 12 is unfolded in the linear structure, a length of the arm of the first metal component 11 is greater than a length of the arm of the second metal component 12, such that the elasticity of the arm of the first metal component 11 is relatively large, and the elasticity of the arm of the second metal component 12 is relatively small. Therefore, after the positioning block 121 is inserted into the corresponding positioning groove 111 in the step S30, the arm of the second metal component 12 having less elasticity can prevent the arm of the first metal component 11 having more elasticity from everting, such that the border frame 10 assembled by the first metal component 11 and the second metal component 12 can maintain the correct shape, thereby facilitating the subsequent squeezed riveting. As shown in FIG. 6, a gap 14 is formed between the positioning block 112 and the first metal component 11 for filling welding materials. The gap 14 is located outside the border frame 10. The gap 14 is disposed outside the border frame 10, which facilitates filling the gap 14 with the welding materials to connect the first metal component 11 and the second metal component 12.

In step S40, a force is applied to the border frame 10 to deform at least one of the riveting groove 13 and the riveting projection 21, such that the riveting projection 21 is latched in the riveting groove 13, and the border frame 10 and the metal middle plate 20 are connected to form the middle frame of the mobile phone.

Figure 7:
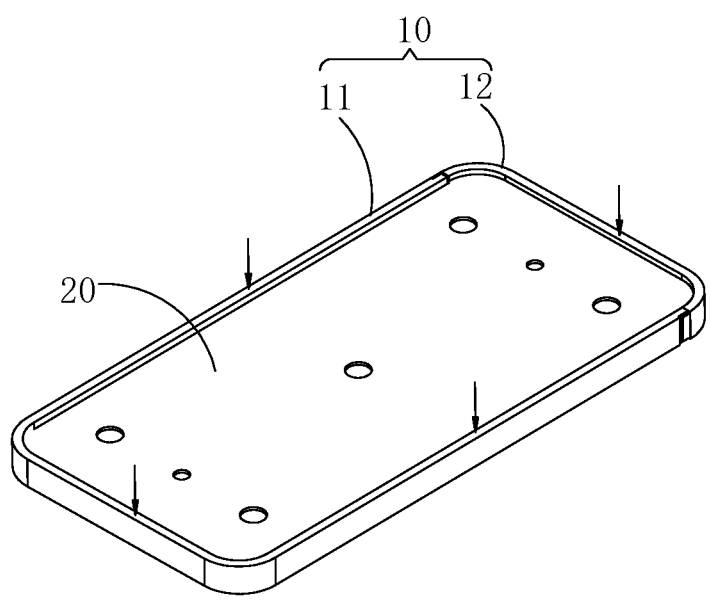
FIG. 7 is a schematic view showing a state of applying force to an assembly structure assembled by the first metal component, the second metal component, and the border frame according to the first embodiment.

In the illustrated embodiment, as shown in FIG. 7, the border frame 10 is squeezed along a direction perpendicular to a top surface and a bottom surface of the metal middle plate 20. The border frame 10 compresses and squeezes the riveting projection 21 to be deformed. The deformed riveting projection 21 is latched in the deformed riveting groove 13, such that the border frame 10 and the metal middle plate 30 are connected to form the middle frame of the mobile phone. Since the hardness of the metal component is greater than the hardness of the metal middle plate 20 by 170 HV to 350 HV, the hardness of the metal component is relatively large, the border frame 10 can squeeze the riveting projection 21 to deform after being pressed and compressed. The compressed border frame 10 and the riveting projection 21 together fill the clearance between the riveting projection 21 and the riveting groove 13. Compared to filling the clearance between the riveting projection 21 and the riveting groove 13 purely by the compression of the metal component having a large hardness, this method can better fill the clearance between the riveting projection 21 and the riveting groove 13, such that the connection between the metal middle plate 20 and the outer border frame 10 can be better achieved.

Figure 8:
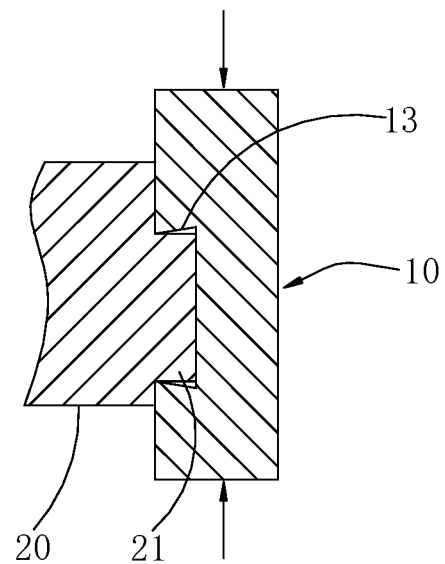
FIG. 8 is a schematic view showing a state in which a riveting projection is inserted in a riveting groove before the riveting projection is latched in the riveting groove according to the first embodiment.
Figure 9:
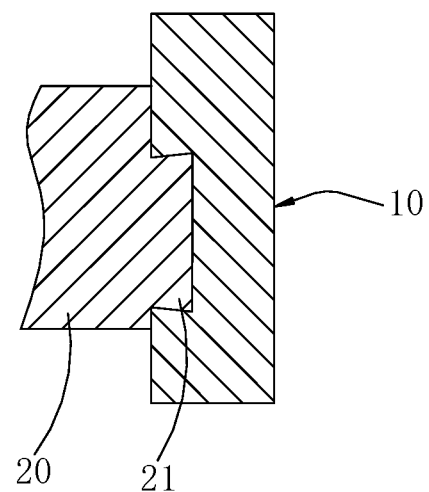
FIG. 9 is a schematic view showing a state in which the riveting projection is inserted in the riveting groove after the riveting projection is latched in the riveting groove according to the first embodiment.

In order to facilitate the border frame 10 to better squeeze the riveting projection 21 to deform, in the illustrated embodiment, as shown in FIG. 8, before the border frame 10 is unstressed, the riveting projection 21 has a rectangular cross-section, and the riveting groove 13 has a swallow-tailed shape. The swallow-tailed edge portion of the riveting groove can squeeze the deformation amount of the riveting projection to run into the riveting groove 13, such that the clearance between the riveting projection 21 and the riveting groove 13 can be better filled. As shown in FIG. 9, after the riveting projection 21 is latched in the riveting groove 13, the riveting projection 21 and the riveting groove 13 both have the swallow-tailed shape, which enables the border frame 10 and the metal middle plate 20 to be well connected, and also makes it difficult for the external water to enter the middle frame of the mobile phone from the connection between the metal middle plate 20 and the outer border frame 10, thereby achieving a good waterproof effect.

In step S50, the corresponding ends of the adjacent metal components are connected.

In the illustrated embodiment, the connecting the corresponding ends of the adjacent metal components is specifically: filling the welding gap with the welding materials to weld the corresponding ends of the first metal component 11 and the second metal component 12.

In step S60, a welding metal protruding from an outer surface of the border frame 10 is milled off.

This step can keep the outer surface of the border frame 10 flat, and facilitate subsequent surface treatment of the middle frame of the mobile phone.

In the process of processing the middle frame of the mobile phone according to the present disclosure, the metal middle plate 20 having the riveting projection 21 at the edges thereof is separately fabricated, at least two metal components having the riveting groove 13 are separately fabricated, and then the metal middle plate 20 and the metal components are combined to form the middle frame of the mobile phone. The riveting projection 21 is inserted into the riveting groove 13 and is in clearance fit with the riveting groove 13. Finally, by applying a squeezing force to the border frame 10 combined from the metal components, the riveting projection 21 and/or the riveting projection 21 are deformed, such that the riveting projection 21 is latched in the riveting groove 13, thereby achieving the purpose of connecting the metal middle plate to the border frame. Compared with the conventional processing method, since the metal middle plate 20 is separately fabricated, and the border frame 10 is combined from separately fabricated metal components, and then the border frame 10 and the metal middle plate 20 are connected by being latched, the amount of intermediate waste generated is very small, the utilization rate of raw materials reaches up to 90%, which can greatly reduce the processing time of waste. In addition, the method also becomes simpler and greatly improves the processing efficiency.

It should be understood that, the sequence of the fabrication of the metal component and the fabrication of the metal middle plate 20 according to the present disclosure can be reversed. It is not limited that the metal component is fabricated firstly and the metal middle plate 20 is fabricated later. In alternative embodiments, the metal middle plate 20 may be fabricated firstly, and the metal component may be fabricated later.

Embodiment 2

Figure 10:
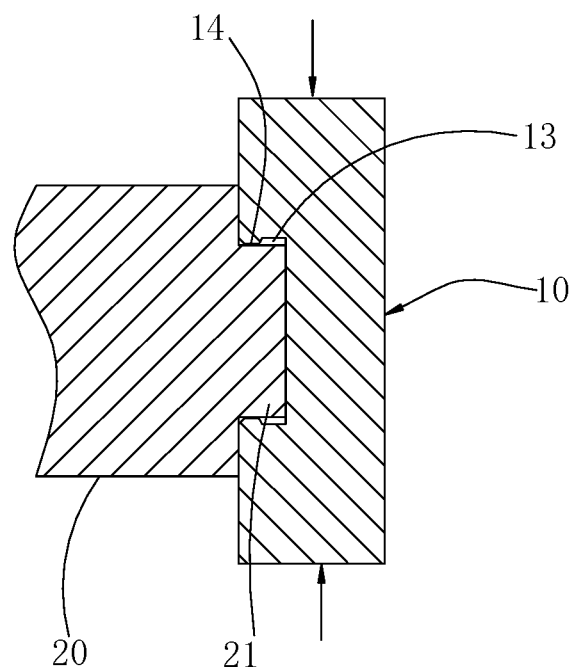
FIG. 10 is a schematic view showing a state in which a riveting projection is inserted in a riveting groove before the riveting projection is latched in the riveting groove according to a second embodiment.
Figure 11:
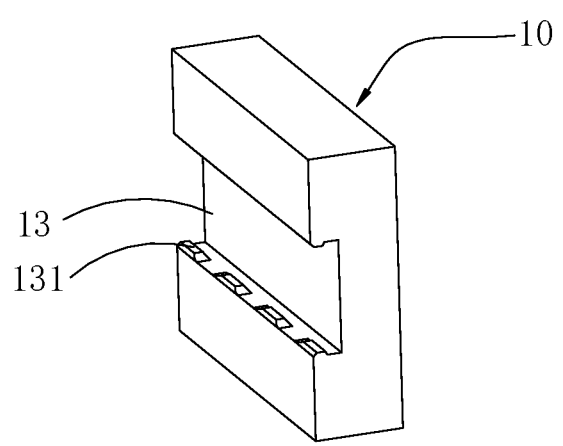
FIG. 11 is a partial schematic view of a border frame before deformation according to the second embodiment.
Figure 12:
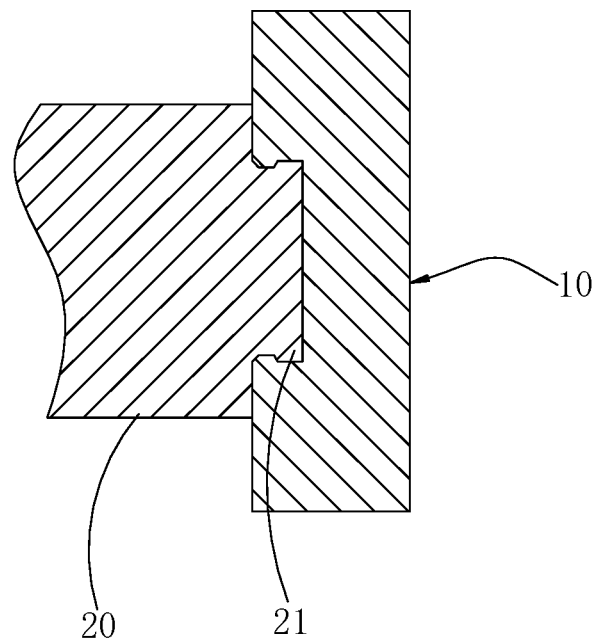
FIG. 12 is a schematic view showing a state in which the riveting projection is inserted in the riveting groove after the riveting projection is latched in the riveting groove according to the second embodiment.
Figure 13:
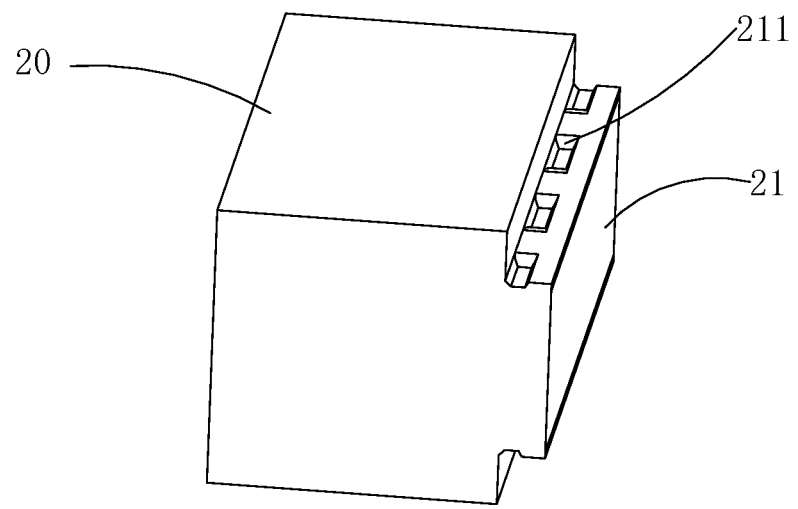
FIG. 13 is a schematic view showing a state of a metal middle plate after being squeezed by the border frame according to the second embodiment.

The difference between the present embodiment and Embodiment 1 is that: as shown in FIG. 10, before the border frame 10 is unstressed, the riveting projections 21 both have a rectangular cross-section. As shown in FIG. 11, a plurality of serrations 131 are provided on edges of the corresponding opening inside the riveting groove 13. The plurality of serrations 131 are spaced along a length direction of the riveting groove 13. When the border frame 10 is squeezed along the direction perpendicular to the top surface and the bottom surface of the metal middle plate 20, as shown in FIG. 12, each of the serrations 131 squeezes the riveting projection 21 to form pressure grooves 211 thereon. As shown in FIG. 13, the riveting projection 21 is deformed under the squeezing of the serrations 131 to fill the clearance between the riveting projection 21 and the riveting groove 13, such that the riveting projection 21 is latched in the riveting groove 13.

Embodiment 3

Figure 14:
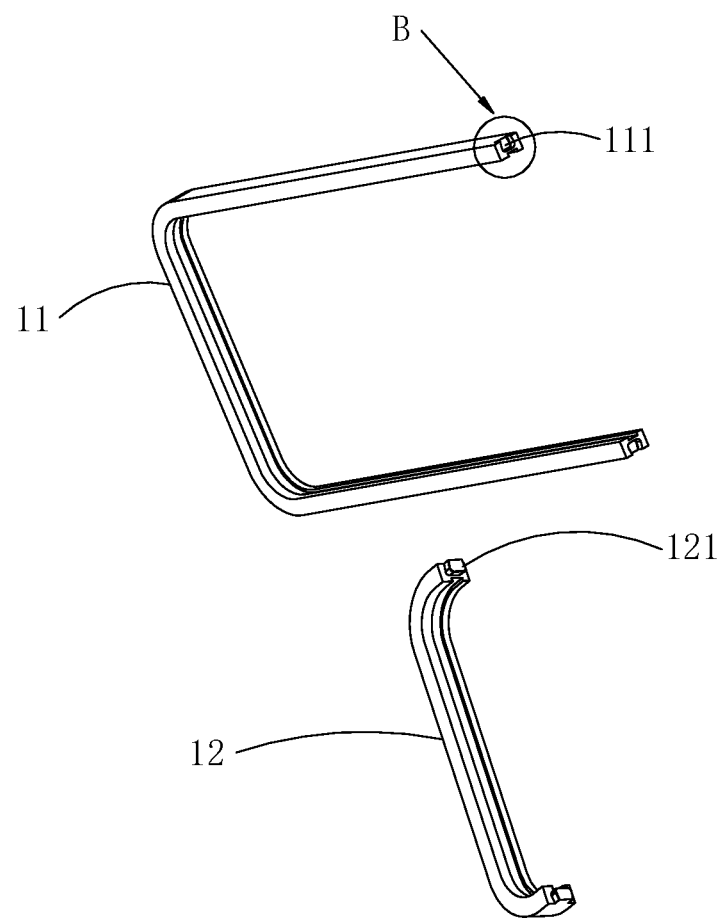
FIG. 14 is a perspective view of a first metal component and a second metal component according to a third embodiment.
Figure 15:
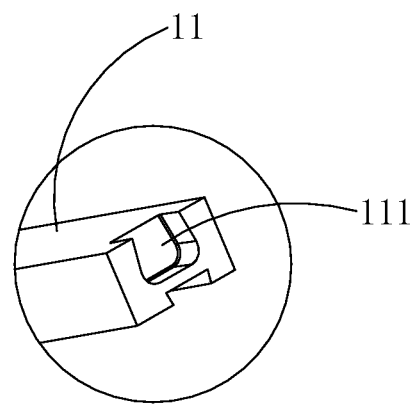
FIG. 15 is an enlarged view of a circled portion B of FIG. 14.
Figure 16:
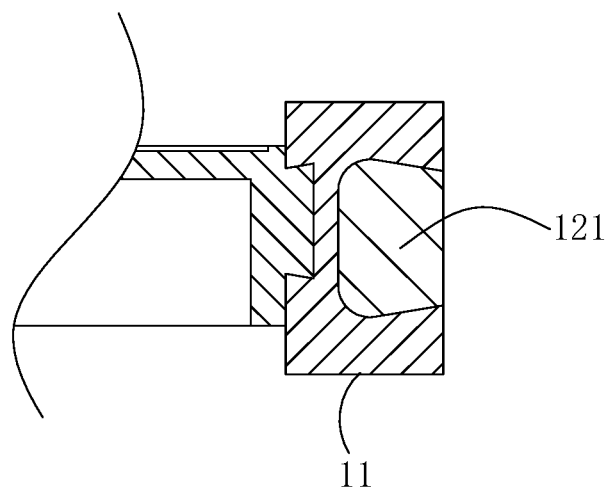
FIG. 16 is a schematic view showing a state in which a positioning block is latched in a positioning groove after a border frame is stressed according to the third embodiment.

The difference between the present embodiment and Embodiment 1 is that: the corresponding ends of the first metal component 11 and the second metal component 12 are not connected by welding. Specifically, as shown in FIG. 14 and FIG. 15, the positioning groove 111 is openly provided corresponding to an end surface and an outer side surface of the first metal component 11. The positioning block 121 is located at an end surface of the second metal component 12. In step S40, as shown in FIG. 16, after the border frame is deformed, the positioning block 121 is latched in the deformed positioning groove 111, such that the first metal component 11 and the second metal component 12 are connected.

Embodiment 4

The difference between the present embodiment and Embodiment 1 is that: the hardness of the metal middle plate 20 is 90 HV to 100 HV, and the hardness difference of the metal components is 0 HV to 50 HV.

In step S40, the border frame 10 is squeezed along the direction perpendicular to the top surface and the bottom surface of the metal middle plate 20, the border frame is compressed by force. The compressed border frame 10 quickly fills the clearance between the riveting projection 21 and the riveting groove 13, and presses the riveting projection 21 to deform. The deformed riveting projection 21 is latched in the deformed riveting groove 13, thereby achieving the connection of the border frame 10 and the middle plate 20. Since the hardness of the metal middle plate is relatively small, and the hardness of the metal component is greater than that of the metal middle plate by only 0 HV to 50 HV, the hardness of the metal component is also relatively small. Therefore, only a small squeezing force is required to realize the deformation of the border frame 10 to fill the clearance between the riveting projection 21 and the riveting groove 13, so as to achieve the purpose of connecting the metal middle plate 20 and the border frame 10. In addition, since the hardness of the metal component is greater than that of the metal middle plate 20 by only 0 HV to 50 HV, the hardness of the metal component and the metal middle plate 20 is very close, such that when the compressed border frame 10 squeezes the riveting projection 21, only a small amount of deformation of the riveting projection 21 can be caused.

In addition, the metal component is made of a lightweight soft metal material. The metal component made of this type of metal material can reduce the weight of the entire middle frame of the mobile phone. Moreover, the metal component is made of aluminum, aluminum alloy, magnesium, or magnesium aluminum alloy. In the illustrated embodiment, the metal component is made of aluminum, and a hardness of aluminum may be 90 HV to 150 HV.

Figure 17:
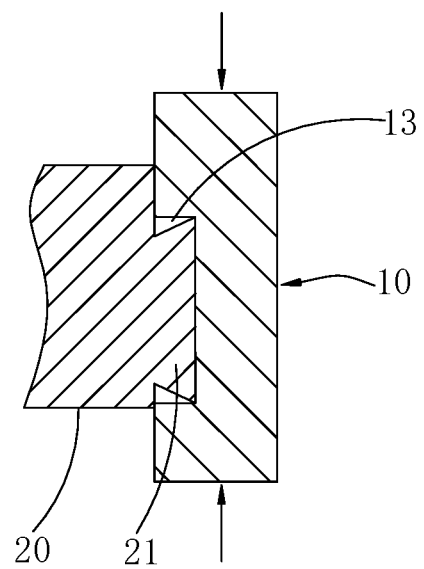
FIG. 17 is a schematic view showing a state in which a riveting projection is inserted in a riveting groove before the riveting projection is latched in the riveting groove according to a fourth embodiment.
Figure 18:
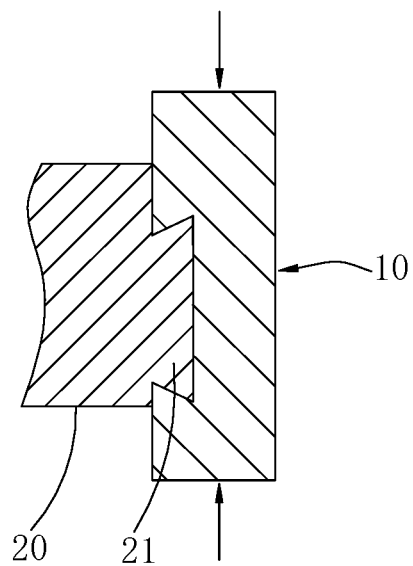
FIG. 18 is a schematic view showing a state in which the riveting projection is inserted in the riveting groove after the riveting projection is latched in the riveting groove according to the fourth embodiment.

Before the force is applied to the border frame 10, as shown in FIG. 17, the riveting groove 13 has a rectangular cross-section, and the riveting projection 21 has a swallow-tailed shape. This allows the deformed border frame 10 not to squeeze the riveting projection before the edges of the riveting groove 13 is in contact with the riveting projection 21 during the deformation of the border frame 10. Therefore, only the deformed border frame 10 fills the clearance between the riveting projection 21 and the riveting groove 13. After the edge portion of the riveting groove 13 is in contact with the riveting projection 21, the force applied to the border frame 10 is removed, the riveting projection 21 is latched in the riveting groove 13 at this time. The effect of the riveting projection 21 being latched in the riveting groove 13 can be achieved by squeezing the border frame 10 made of the soft metal material to compression, which is very labor-saving and can achieve a better latching effect. After the riveting projection 21$d$ is latched in the riveting groove 13, as shown in FIG. 18, the riveting projection 21 and the riveting groove 13 both have the swallow-tailed shape. This latching manner can improve the connection between the metal middle plate 20 and the metal component, and also make the external water difficult to enter the middle frame of the mobile phone from the connection between the metal middle plate 20 and the border frame 10, thereby achieving good waterproof effect.

Embodiment 5

Figure 19:
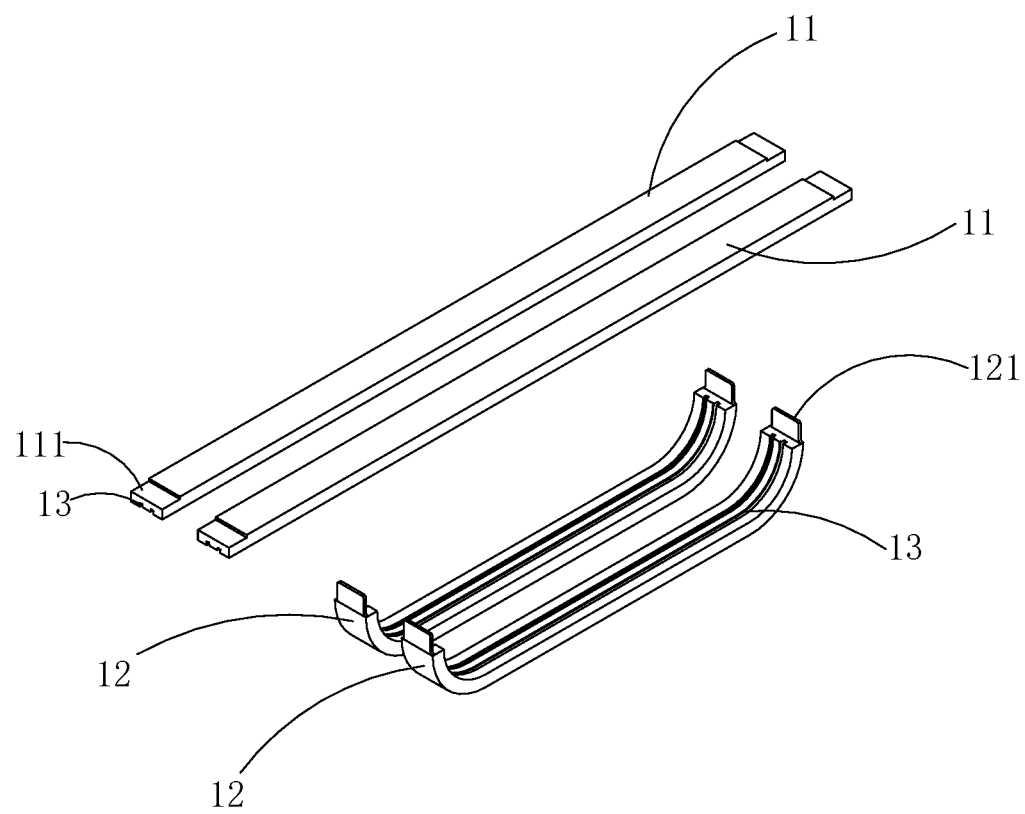
FIG. 19 is a perspective view of a first metal component and a second metal component according to a fifth embodiment.

The difference between the present embodiment and Embodiment 1 is that: in step S10, as shown in FIG. 19, the number of the metal components is four, two of which are linear first metal components 11, and the other two are U-shaped second metal components 12. The riveting groove 13 is provided on inner side surfaces of the first metal component 11 and the second component 12. Each end of the first metal component 11 defines a positioning groove 111, and each end of the second metal component 12 is provided with a positioning block 121. In the illustrated embodiment, the positioning groove 111 is openly provided corresponding to an outer side surface, an end surface, a top surface, and a bottom surface of the first metal component 11.

The minimum hardness difference between the metal component and the metal middle plate is 170 HV. In addition, the metal component may be made of a titanium material. Titanium is a lightweight and high strength metal material. The metal component is made of the titanium material, on the one hand, the first metal component 11 and the second metal component 12 are not deformed when the periphery of the metal middle plate 20 is squeezed by the border frame 10, thereby ensuring the shape of the outer frame; on the other hand, the weight of the entire middle frame of the mobile phone can be reduced. A hardness of titanium may be 300 HV to 400 HV.

Figure 22:
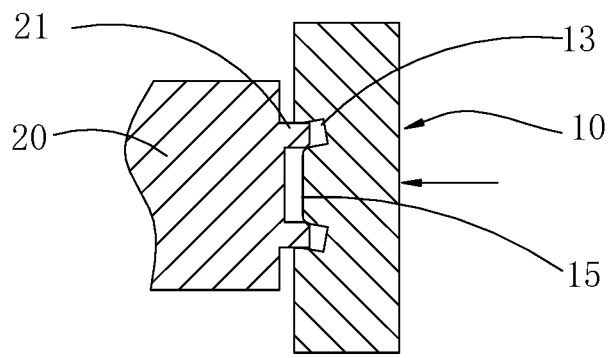
FIG. 22 is a schematic view showing a state in which a riveting projection is inserted in a riveting groove before the riveting projection is latched in the riveting groove according to the fifth embodiment.

As shown in FIG. 22, the number of the riveting grooves 13 on each of the metal components is two. The two riveting grooves 21 are symmetrically arranged in a "∧" shape. A distance between bottoms of the two riveting grooves 13 is greater than a distance between openings of the two riveting grooves 13e. A squeezing projection 15 having a trapezoidal cross-section is formed between the riveting grooves 13. In the illustrated embodiment, the riveting groove 13 is openly provided corresponding to the outer side surface, the end surface, the top surface, and the bottom surface of the first metal component 11.

Step S10 specifically includes: in step S11, four linear profiles having the riveting grooves 13 are fabricated, in which two linear profiles are first linear profiles, and the other two linear profiles are second linear profiles. The riveting groove 13 extends through the linear profile along a length direction of the linear profile. In step S12, the first linear profile is used as the first metal component 11, and the second linear profile is bent to form the second metal component 12. In step S13, the positioning groove 111 is processed at each of the ends of the first metal component 11, and the positioning block 121 is processed at each of the ends of the second metal component 12.

The metal middle plate of the present embodiment is made of the same metal material as the metal middle plate of Embodiment 1. In step S20, as shown in FIG. 22, the number of the riveting projections 21 on the metal middle plate 20 is two. The riveting projections 21 are disposed in one-to-one correspondence with the riveting grooves 13. The riveting projections 21 are arranged in parallel. In step S30, when the metal component is mounted on the edges of the metal middle plate 20, free ends of the riveting projections 21 are inserted into the corresponding riveting grooves 13, respectively. The squeezing projection 15 is inserted between the riveting projections 21.

In the illustrated embodiment, in the step S30, during assembly, the two first metal components 11 are firstly mounted on both sides of the metal middle plate 20, respectively; such that the riveting projection 21 at the side portion of the metal middle plate 20 is inserted into the riveting groove 13 of the first metal component 11. Subsequently, the two second metal components 12 are mounted on the edges of the metal middle plate 20 from both ends of the metal middle plate 20 by inserting. During inserting, the riveting groove portions on two arms of each of the second metal components 12 are aligned with the riveting projection portions at both sides of the metal middle plate 20, respectively, such that the riveting projection of the metal middle plate is inserted into the riveting groove of the second metal component 12. After being mounted, the positioning block 121 of the second metal component 12 is inserted into the positioning groove 13 of the first metal component 11. The two first metal components 11 and the two second metal components 12 cooperatively form the border frame 10 surrounding the metal middle plate 20. The positioning block 121 of the second metal component 12 is inserted into the positioning groove of the first metal component 11, which enables the second metal component 12 to position the first metal component 11 during assembly, such that the border frame 10 assembled by the two first metal components 11 and the second metal components 12 can maintain the correct shape, thereby facilitating the subsequent squeezed riveting. A gap 14 is formed between the positioning block 121 and the first metal component 11. The gap 14 is located outside the border frame 10 and is configured to subsequently fill welding materials, thereby welding the corresponding ends of the first metal component 11 and the second metal component 12.

Figure 20:
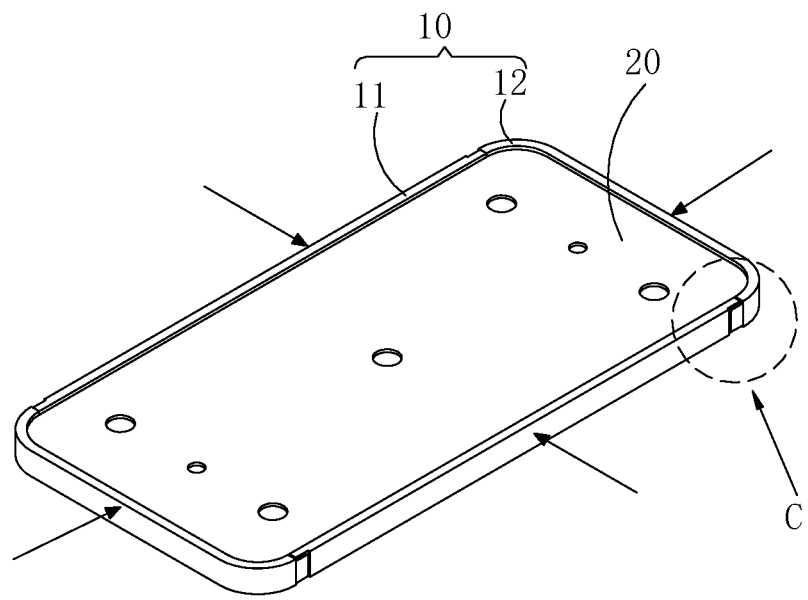
FIG. 20 is a schematic view showing a state of stress of an assembly structure in which an outer border frame and a metal middle plate are combined according to the fifth embodiment.

In step S40, as shown in FIG. 20, thrust is applied to four sides of the border frame 10, each of the metal components squeezes the riveting projection 21 along a lateral direction of the metal middle plate 20. Since the minimum hardness difference between the metal component and the metal middle plate is 170 HV, the hardness of the metal component is very large with respect to the hardness of the metal middle plate 20, the metal component does not deform when the metal component squeezes the riveting projection 21 along the lateral direction of the metal middle plate 20. Therefore, the riveting groove 13 is not deformed, and the riveting projection 21 is squeezed and deformed to be latched in the undeformed riveting groove 13.

Figure 23:
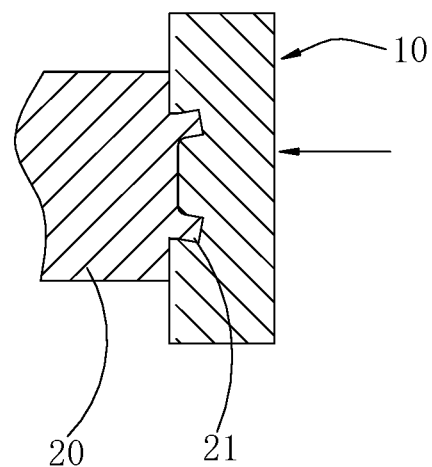
FIG. 23 is a schematic view showing a state in which the riveting projection is inserted in the riveting groove after the riveting projection is latched in the riveting groove according to the fifth embodiment.

FIG. 23 is a schematic view of the rivet projection 21 being latched in the riveting groove 13. After the four sides of the border frame 10 are stressed, the two riveting projections 21 are inclined and deformed in a direction away from each other under the squeezing of the squeezing projection 15 and the two riveting grooves 13, and gradually enter the two riveting grooves 13 respectively, until the riveting projections 21 completely enter the corresponding riveting grooves 13. Under the condition that the metal component is not easily deformed by squeezing, this arrangement of the riveting groove 13 and the riveting projection 21 allows the riveting projection 21 to be better deformed to fill the riveting groove 13, thereby achieving a good riveting effect.

In addition, before the force is applied to the border frame 10, as shown in FIG. 22, the riveting projection 21 has a rectangular cross-section, and each of the riveting grooves 13 has a rectangular cross-section. An angle formed between the riveting grooves 13 is 5° to 30°. In this angle range, an inclination angle of the side wall of the riveting groove 13 is not large, such that the entire riveting projection 21 is gradually deformed under the squeezing of the squeezing projection 15 and the riveting groove 13, and smoothly and completely enters the riveting groove 13, thereby achieving the effect of completely filling the clearance between the riveting projection 21 and the riveting groove 13. Before the periphery of the border frame 10 assembled by the two first metal components 11 and the second metal components 12 is squeezed, there is a certain interval between the adjacent first metal components 11 and the second metal components 12. When the periphery of the border frame 10 assembled by the two first metal components 11 and the two second metal components 12 is squeezed, the first metal component 11 and the second metal component 12 are brought closer to each other due to squeezing the riveting projections 21 to deform. However, if the inclination angle of the side wall of the riveting groove 13 is too large, the deformation rate of the riveting projection 21 is also too large, which may cause a phenomenon in which only a portion of the riveting projection 21 enters the riveting groove 13 due to excessive deformation rate and is latched. This phenomenon causes a relatively large interval between the first metal component 11 and the second metal component 12, such that the U-shaped first metal component 11 and the linear second metal component 12 cannot be spliced into the border frame 10. In the illustrated embodiment, the angle between the riveting grooves 13 is 10°. In alternative embodiments, the angle between the riveting grooves 13 may also be any value within the range, such as 15°, 20°, 25°, and the like.

Figure 21:
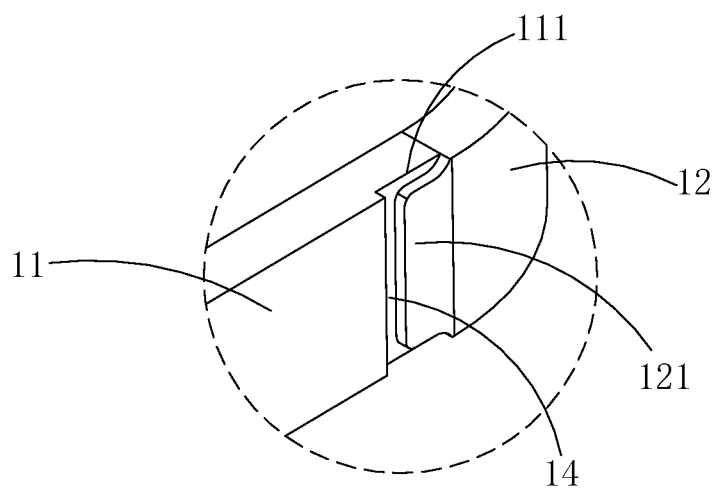
FIG. 21 is an enlarged view of a circled portion C of FIG. 20.

As shown in FIG. 21, in the step S30, the positioning block 121 is inserted into the corresponding positioning groove 111. A gap 14 is formed between the positioning block 121 and the end of the second metal component 12. The gap 14 is exposed on the outside of the border frame 10.

After the step S40, the process further includes step S50: connecting the corresponding ends of the adjacent metal components. In the illustrated embodiment, the connecting the corresponding ends of the adjacent metal components is specifically: filling the gap 14 with the welding materials to weld the first metal component 11 and the second metal component 12.

The technical features of the embodiments described above can be arbitrarily combined. In order to make the description succinct, there is no describing of all possible combinations of the various technical features in the foregoing embodiments. It should be noted that there is no contradiction in the combination of these technical features which should be considered as the scope of the description.

Although the present disclosure is illustrated and described herein with reference to specific embodiments, the present disclosure is not intended to be limited to the details shown. It is to be noted that, various modifications may be made in the details within the scope and range of equivalents of the claims and without departing from the present disclosure. Therefore, the protection scope of the present disclosure shall be subject to the protection scope of the claims.

What is claimed is:

1. A process of processing a middle frame of a mobile phone, comprising:
    providing at least two metal components, each of the metal components defining a riveting groove;
    providing a metal middle plate having a riveting projection at edges thereof;
    correspondingly mounting each of the metal components on the edges of the metal middle plate to form a border frame surrounding the metal middle plate, respectively; the riveting projection being received in the riveting groove of the metal component, the riveting projection being in clearance fit with the riveting groove; and
    applying a force to the border frame to deform at least one of the riveting groove and the riveting projection, such that the riveting projection is latched in the riveting groove, and the border frame and the metal middle plate are connected to form the middle frame of the mobile phone.

2. The process of processing the middle frame of the mobile phone according to claim 1, wherein a hardness of the metal component is greater than a hardness of the metal middle plate;
    the applying the force to the border frame to deform at least one of the riveting groove and the riveting projection, such that the riveting projection is latched in the riveting groove, and the border frame and the metal middle plate are connected to form the middle frame of the mobile phone comprises:
    squeezing the border frame along a direction perpendicular to a top surface and a bottom surface of the metal middle plate, wherein the border frame compresses and squeezes the riveting projection to deform, the deformed riveting projection is latched in the deformed riveting groove, such that the border frame and the metal middle plate are connected to form the middle frame of the mobile phone.

3. The process of processing the middle frame of the mobile phone according to claim 2, wherein the hardness of the metal middle plate has a Vickers Hardness of 90 to 100.

4. The process of processing the middle frame of the mobile phone according to claim 3, wherein a hardness difference between the metal component and the metal middle plate is a Vickers Hardness of 170 to 350.

5. The process of processing the middle frame of the mobile phone according to claim 4, wherein prior to applying the force to the border frame, the riveting groove has a swallow-tailed cross-section, the riveting projection has a rectangular cross-section, and a width of the riveting projection is less than a minimum width of the riveting groove.

6. The process of processing the middle frame of the mobile phone according to claim 4, wherein a plurality of serrations are provided on edges of the riveting groove, the plurality of serrations are spaced along a length direction of the riveting groove; when the border frame is squeezed along the direction perpendicular to the top surface and the bottom surface of the metal middle plate, the riveting projection is deformed under the squeezing of the plurality of serrations to fill a clearance between the riveting projection and the riveting groove.

7. The process of processing the middle frame of the mobile phone according to claim 3, wherein a hardness difference between the metal component and the metal middle plate is a Vickers Hardness of 0 to 50.

8. The process of processing the middle frame of the mobile phone according to claim 7, wherein prior to applying the force to the border frame, the riveting groove has a rectangular cross-section, the riveting projection has a swallow-tailed shape, and a maximum width of the riveting projection is less than a width of the riveting groove.

9. The process of processing the middle frame of the mobile phone according to claim 2, wherein the at least two metal components comprise a first metal component and a second metal component, the first metal component and the second metal component are U-shaped.

10. The process of processing the middle frame of the mobile phone according to claim 9, wherein a length of the first metal component is greater than a length of the second metal component, each end of the first metal component defines a positioning groove, each end of the second metal component is provided with a positioning block; after each of the metal components is mounted on the edges of the middle plate, the positioning block of the second metal component is inserted into the positioning groove of the first metal component.

11. The process of processing the middle frame of the mobile phone according to claim 10, wherein the providing at least two metal components, each of the metal components defining a riveting groove specifically comprises:
    fabricating two linear profiles having riveting grooves, which respectively being a first linear profile and a second linear profile, wherein the riveting groove extends through the linear profile along a length direction of the linear profile;

bending the first metal linear profile and the second linear profile to form the first metal component and the second metal component, respectively;

processing the positioning groove at each of the ends of the first metal component, processing the positioning block at each of the ends of the second metal component.

12. The process of processing the middle frame of the mobile phone according to claim 10, wherein the positioning groove is openly provided corresponding to an outer side surface, a top surface, a bottom surface, and an end surface of the first metal component; after the positioning block is inserted into the positioning groove, a gap is formed between the positioning block and the end of the first metal component, the gap is located outside the border frame; after the applying the force to the border frame to deform at least one of the riveting groove and the riveting projection, such that the riveting projection is latched in the riveting groove, and the border frame and the metal middle plate are connected to form the middle frame of the mobile phone, the process further comprises a step of: connecting the corresponding ends of the adjacent metal components; the step of connecting the corresponding ends of the adjacent metal components is specifically: filling welding materials into the gap to connect the corresponding ends of the first metal component and the second metal component.

13. The process of processing the middle frame of the mobile phone according to claim 10, wherein the positioning groove is openly provided corresponding to an outer side surface and an end surface of the first metal component; after the force is applied to the border frame, the positioning groove is deformed, and the positioning block is latched in the deformed positioning groove to connect the first metal component and the second metal component.

14. The process of processing the middle frame of the mobile phone according to claim 1, wherein a hardness of each of the metal components is greater than a hardness of the metal middle plate; the applying the force to the border frame to deform at least one of the riveting groove and the riveting projection, such that the riveting projection is latched in the riveting groove, and the border frame and the metal middle plate are connected to form the middle frame of the mobile phone comprises: applying a thrust to four sides of the border frame, such that the border frame squeezes the riveting projection along four sides of the metal middle plate, the riveting projection is squeezed and deformed to be latched in the undeformed riveting groove.

15. The process of processing the middle frame of the mobile phone according to claim 14, wherein a hardness of the metal middle plate has a Vickers Hardness of 90 to 100, and a minimum hardness difference between the metal component and the metal middle plate is a Vickers Hardness of 170.

16. The process of processing the middle frame of the mobile phone according to claim 14, wherein the number of the metal components is four, two of which are linear first metal components, and the other two are U-shaped second metal components; each end of the first metal component defines a positioning groove, each end of the second metal component is provided with a positioning block; after each of the metal components is mounted on the edges of the metal middle plate, the positioning block of the second metal component is inserted into the positioning groove of the first metal component.

17. The process of processing the middle frame of the mobile phone according to claim 16, wherein the positioning groove is openly provided corresponding to an outer side surface, a top surface, a bottom surface, and an end surface of the first metal component; after the positioning block is inserted into the positioning groove, a gap is formed between the positioning block and the end of the first metal component, the gap is located outside the border frame; after the applying the force to the border frame to deform at least one of the riveting groove and the riveting projection, such that the riveting projection is latched in the riveting groove, and the border frame and the metal middle plate are connected to form the middle frame of the mobile phone, the process further comprises: connecting the corresponding ends of the adjacent metal components; the connecting the corresponding ends of the adjacent metal components is specifically: filling welding materials into the gap to connect the corresponding ends of the first metal component and the second metal component.

18. The process of processing the middle frame of the mobile phone according to claim 16, wherein the providing at least two metal components, each of the metal components defining a riveting groove specifically comprises:

fabricating four linear profiles having riveting grooves, wherein two linear profiles are first linear profiles, and the other two linear profiles are second linear profiles; the riveting groove extends through the linear profile along a length direction of the linear profile; the first linear profile is configured as the first metal component;

bending the second linear profile to form the second metal component;

processing the positioning groove at each of the ends of the first metal component, processing the positioning block at each of the ends of the second metal component.

19. The process of processing the middle frame of the mobile phone according to claim 14, wherein the number of the riveting grooves on each of the metal components is two, the two riveting grooves are symmetrically arranged in a "∧" shape, a distance between bottoms of the two riveting grooves is greater than a distance between openings of the two riveting grooves, a squeezing projection having a trapezoidal cross-section is formed between the riveting grooves; the number of the riveting projections on the metal middle plate is two, the riveting projections are disposed in one-to-one correspondence with the riveting grooves, the riveting projections are disposed in parallel; when the metal component is mounted on the edges of the metal middle plate, free ends of the riveting projections are inserted into the corresponding riveting grooves, respectively; the squeezing projection is inserted between the riveting projections; after the four sides of the border frame are stressed, the two riveting projections are inclined and deformed in a direction away from each other under the squeezing of the squeezing projection and the two riveting grooves, and gradually enter the two riveting grooves respectively, until the riveting projections completely enter the corresponding riveting grooves.

20. The process of processing the middle frame of the mobile phone according to claim 19, wherein a cross-section of the riveting groove is similar to a cross-section of the riveting projection before deformation, and the cross-sections of the riveting groove and the riveting projection before deformation are rectangular, an angle formed between the riveting grooves is 5° to 30°.

* * * * *